US006921462B2

(12) United States Patent
Montgomery et al.

(10) Patent No.: US 6,921,462 B2
(45) Date of Patent: Jul. 26, 2005

(54) METHOD AND APPARATUS FOR PRODUCING ALIGNED CARBON NANOTUBE THERMAL INTERFACE STRUCTURE

(75) Inventors: Stephen W. Montgomery, Federal Way, WA (US); Tomm V. Aldridge, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 10/024,057

(22) Filed: Dec. 17, 2001

(65) Prior Publication Data

US 2003/0111333 A1 Jun. 19, 2003

(51) Int. Cl.$^7$ ............................................. B01J 19/08
(52) U.S. Cl. ................ 204/164; 423/445 R; 423/445 B
(58) Field of Search ...................... 204/164; 423/445 R, 423/445 B

(56) References Cited

U.S. PATENT DOCUMENTS

| | | | | |
|---|---|---|---|---|
| 5,102,824 A | * | 4/1992 | Neugebauer et al. | ......... 438/28 |
| 5,316,080 A | | 5/1994 | Banks et al. | |
| 5,604,037 A | | 2/1997 | Ting et al. | |
| 5,825,624 A | | 10/1998 | Arnold et al. | |
| 5,837,081 A | | 11/1998 | Ting et al. | |
| 5,965,267 A | | 10/1999 | Nolan et al. | |
| 5,972,265 A | * | 10/1999 | Marra et al. | ................. 264/112 |
| 6,312,303 B1 | * | 11/2001 | Yaniv et al. | ................... 445/24 |
| 6,407,922 B1 | | 6/2002 | Eckblad et al. | ............. 361/704 |
| 6,504,292 B1 | | 1/2003 | Choi et al. | |
| 6,630,772 B1 | * | 10/2003 | Bower et al. | ................ 313/311 |
| 6,651,736 B2 | | 11/2003 | Chiu et al. | |
| 2002/0105071 A1 | | 8/2002 | Mahajan et al. | |
| 2003/0117770 A1 | | 6/2003 | Montgomery | |
| 2003/0135971 A1 | | 7/2003 | Liberman et al. | |
| 2003/0179559 A1 | | 9/2003 | Engelhardt et al. | |
| 2004/0150100 A1 | | 8/2004 | Dubin et al. | |

FOREIGN PATENT DOCUMENTS

| | | |
|---|---|---|
| EP | 0538798 | 4/1993 |
| EP | 0689244 | 12/1995 |
| EP | 1054036 | 11/2000 |
| EP | 1109218 | 6/2001 |
| WO | WO-00/33628 | 6/2000 |
| WO | WO-01/30694 | 5/2001 |
| WO | WO-01/92381 | 12/2001 |

OTHER PUBLICATIONS

Bellar, R J., et al., "High Conduction Thermal Interface Material", *IBM Technical Disclosure Bulletin, 36 (10),* (Oct. 1, 1993),581–583.
Zhang, Y. , et al., "Formation of metal nanowires on suspended single–walled carbon nanotubes", *Applied Physics Letters, 77(19),* (Nov. 6, 2000), 3015–3017.
Andrews, R., "Nanotube Composite Carbon Fibers", *Applied Physics Letters, 75,* (Aug. 30, 1999), 1329–1331.

* cited by examiner

*Primary Examiner*—Kishor Mayekar
(74) *Attorney, Agent, or Firm*—Schwegman, Lundberg, Woessner & Kluth, P.A.

(57) ABSTRACT

The invention relates to a method and apparatus for producing aligned carbon nanotube thermal interface structures using batch and continuous manufacturing processes. In a batch process a capacitor is immersed in a bath containing a slurry of thermoplastic polymer containing randomly oriented carbon nanotubes and energized to create an electrical field to orient the carbon nanotubes prior to curing. In a continuous process, slurry carried by a conveyor receives the nanotube aligning electric field from capacitors positioned on both sides of the conveyor bearing the slurry.

21 Claims, 6 Drawing Sheets

METHOD AND APPARATUS FOR PRODUCING ALIGNED CARBON NANOTUBE THERMAL INTERFACE STRUCTURE

FIELD OF THE INVENTION

The present invention relates generally to providing cooling solutions to electronic circuits, and, more specifically, to methods and apparatus for the fabrication of a thermal interface structure using carbon nanotubes to improve thermal performance of a die containing an electronic circuit.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a process of forming a thermal interface structure having aligned carbon nanotubes embedded in a polymer interstitial material. More specifically, it relates to processes for aligning carbon nanotube fibers suspended in a slurry of nanotubes and liquid polymer and curing the aligned composite to form a billet which can be formed into a thermal interface structure. The use of aligned carbon nanotube fibers in the thermal interface structure provides a thermal interface structure having high thermal conductivity. The thermal interface structure may be used, for example to provide a highly thermally conductive path between a surface of an electronic circuit and a surface of a cooling solution such as a heat sink.

Arrays of nano tubes are being currently manufactured by Nano-Lab, Inc. using a high temperature chemical vapor deposition process. Such arrays are manufactured on a one at a time basis at a high temperature which makes deposition of the nanotubes directly on a processor die unfeasible. The nanotubes in the arrays are primarily multi-walled and therefore do not have the purity and exceptional thermal conductivity of single-walled nanotubes. It is desired to provide a batch type or continuing manufacturing process for thermal interface structures which allows for control of the quality of the polymer and the nanotubes.

Figure 1:
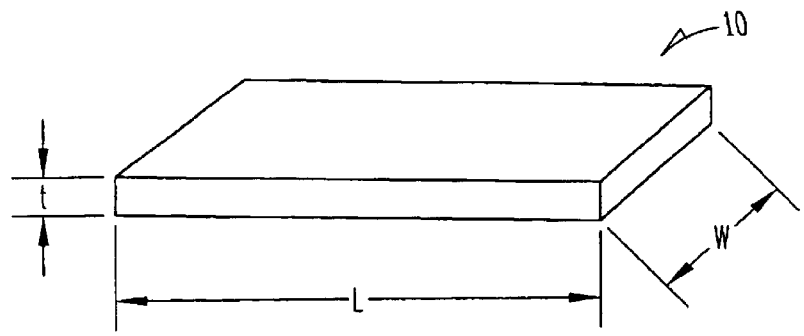
FIG. 1 is a perspective view of an embodiment of a thermal interface structure manufactured in accordance with the present invention.

FIG. 1 is a perspective view of a thermal interface structure 10 formed in accordance with the present invention. Thermal interface structure 10 has a length L and a width W and a thickness t as shown in FIG. 1. In practice, the length L and width W of thermal interface structure 10 are selected to provide a substantial heat exchange surface while falling within the outlines of the exposed surface of the electronic circuit such as a semiconductor die which is to be cooled. In one embodiment the length and width are 2 cm and 1 cm. Although in the present embodiment the structure 10 is shown in a highly regular form, for the purposes of illustration, it need not necessarily be as regular as shown.

The thickness t of the thermal interface structure 10, in one embodiment, may be limited by the length of the carbon nanotubes available. In one embodiment it may fall within a range of about 5 to 20 microns. Single-walled nanotubes manufactured using varied processes are available. Such nanotubes may be manufactured having varying lengths. Of course, increasing the length of the nanotubes and the thickness of the thermal interface structure 10 will increase the thermal impedance of the path between the die and the heat sink. Because of the exceptionally high thermal conductivity of single-walled carbon nanotubes, however, there is little to be gained by attempting to limit the thickness of the thermal interface structure to a thickness less than the range of lengths of the particular microtubes that are available using currently available manufacturing processes.

Figure 2:
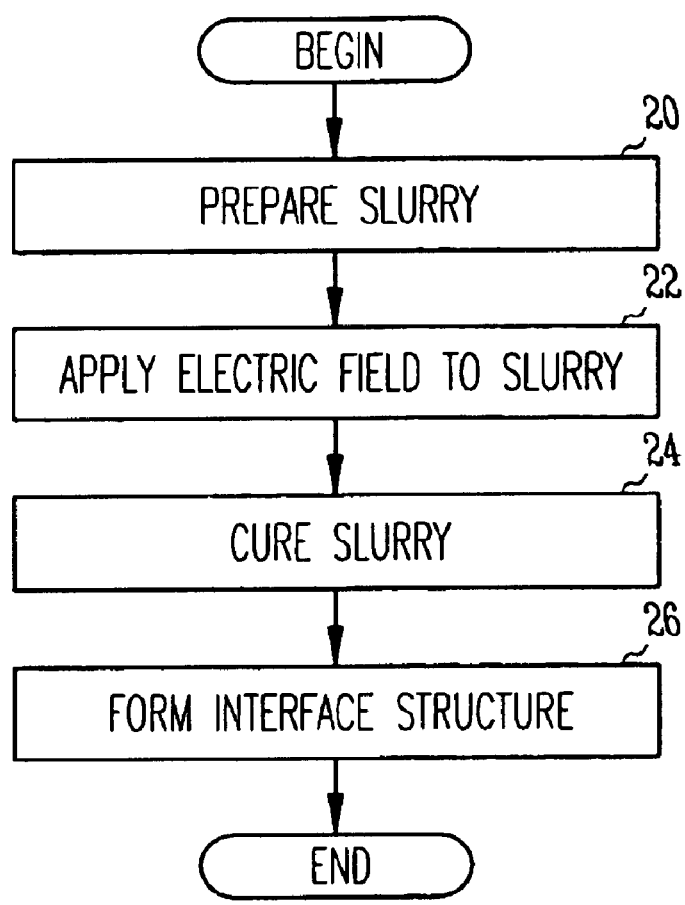
FIG. 2 is a is a process flow chart of the present invention.

FIG. 2 is a flow chart of an embodiment of a process of the present invention. The process begins in block 20 with preparing a slurry of a polymeric interstitial material and a quantity of randomly oriented carbon nanotubes. In block 22 an electrical field is applied to the slurry to align the carbon nanotubes with the direction of the electrical field. After aligning the carbon nanotubes, the slurry is cured in block 24 and the resulting billet of cured material is cut or otherwise formed into completed thermal interface structures 10 in block 26 by cutting or similar forming processes. In one embodiment, the resulting billet is used as thermal interface structure 10 without further cutting or other forming.

Figure 3:
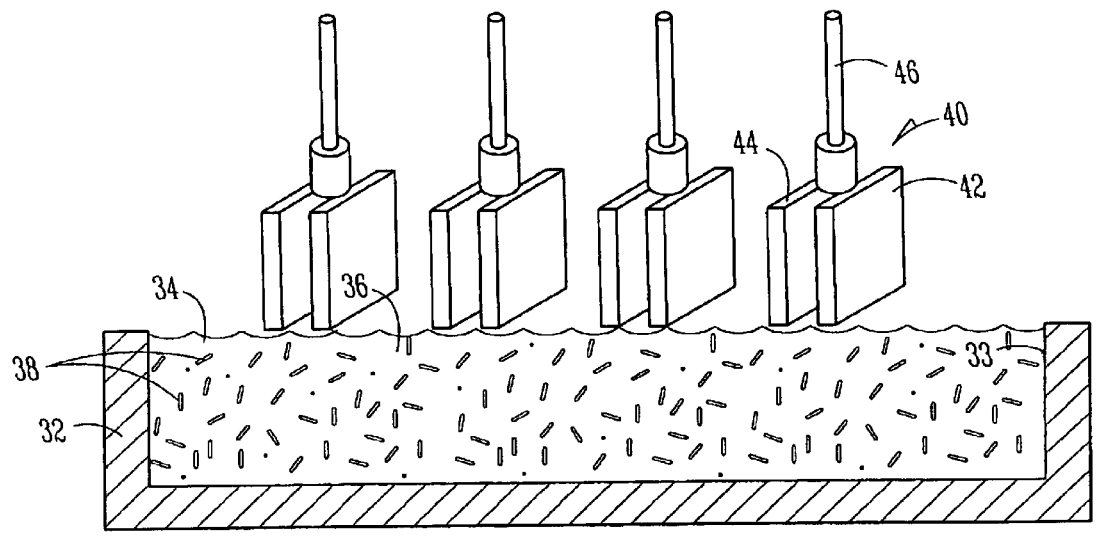
FIG. 3 is an illustrative elevational schematic of apparatus for fabricating thermal interface structures including a vat containing a monodisperse slurry of polymer and nanotubes and movable and adjustable capacitors positioned for insertion into the slurry; according to an embodiment of the present invention.

FIG. 3 illustrates apparatus according to an embodiment of the manufacturing process of FIG. 2 for making the thermal interface structure 10 of the present invention. A vat 32, the walls 33 of which are illustrated in cross-section, is filled with a composite monodispersed slurry 34 which is comprised of interstitial material 36 in liquid form and a plurality of single walled carbon nanotubes 38. The carbon nanotubes 38 can be produced in accordance with a number of manufacturing processes and then formed into thermal interface structures 10 in accordance with embodiments of the present invention. The present invention provides a way to orient nanotubes 38 for optimal thermal conductivity characteristics of the resulting thermal interface structure 10. Some embodiments of the present invention do not require operations to be carried out at the high temperatures inherent in chemical vapor deposition processes which are necessary to formation of aligned nanotubes directly on substrate surfaces. Batch or continuous processes in accordance with the present invention provide advantages over the production of thermal interface structures by forming aligned nanotubes directly on substrates.

In one embodiment, the interstitial material 36 is a polymer. In one embodiment polymer 36 is selected from the group of thermoplastic polymers selected from the group consisting of polycarbonate, polypropylene, polyacetal, polyoxymethylene and polyformaldehyde. Other suitable thermoplastic polymers can also be used.

Slurry 34 contains nanotubes 38 in monodisperse form, that is to say in a form having the lowest and narrowest possible dimensional scatter about a given nanotube length. Merely providing nanotubes 38 in a randomly oriented form in the monodisperse slurry 34 does not provide for optimal thermal conductivity characteristics in the polymeric matrix material 34. Accordingly, it is necessary to provide for the orienting of nanotubes 38 in the interstitial material 36 prior to curing the slurry 34 into a billet 10 of thermal interface material.

The apparatus shown in FIG. 3 provides for such orientation of the carbon nanotubes 38 in the thermal interface material. In the batch forming process apparatus shown in FIG. 3, vat 32 has a plurality of capacitors 40 associated with it for carrying out a batch process as illustrated in FIGS. 4 through 9 for forming thermal interface structures 10 having a preferred thermal path defined by aligned nanotube fibers.

Capacitors 40 are, in the embodiment illustrated, parallel plate capacitors with pairs of plates 42, 44. Each capacitor is, in the embodiment shown in FIG. 3, suspended from a movable transport mechanism 46 (shown simply as a rod in FIG. 3) for lowering each capacitor 40 into the slurry 34 of interstitial polymer 36 and randomly aligned nanotubes 38. Capacitor plates 42 and 44 are sized with their surface area dimensions selected so that one or more thermal interface structures 10 having width W and length L can be formed between a pair of plates. In addition to being movable vertically into and out of the slurry 34 in vat 32, plates 42 and 44 are also adjustable toward and away from each other while maintaining their parallel orientation relative to each other.

Figure 4:
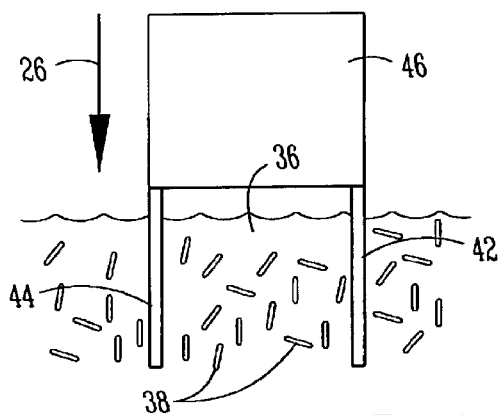
FIGS. 4 through 9 are illustrative elevational schematics of a typical capacitor, in the apparatus depicted in FIG. 1, at various stages of manufacture in accordance with an embodiment of a manufacturing process.
Figure 5:
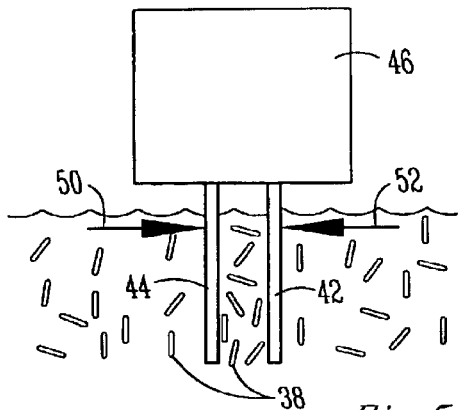

In accordance with a first portion of the manufacturing process, FIG. 4 shows, in a side elevation view, the edges of capacitor plates 42 and 44 being moved in a direction aligned with arrow 26 into slurry 34. After insertion of the plates 42 and 44 of capacitor 40 into the slurry in FIG. 4, plates 42 and 44 are adjusted relative to each other to move them toward each other in the directions shown by arrows 50 and 52 respectively of FIG. 5. It will be understood that relative movement of the plates toward each other by mechanism 46 may be achieved by moving of one or both of the plates 42, 44 toward each other. It is understood that it is a matter of design choice whether one or both of the plates are actually moved.

Figure 6:
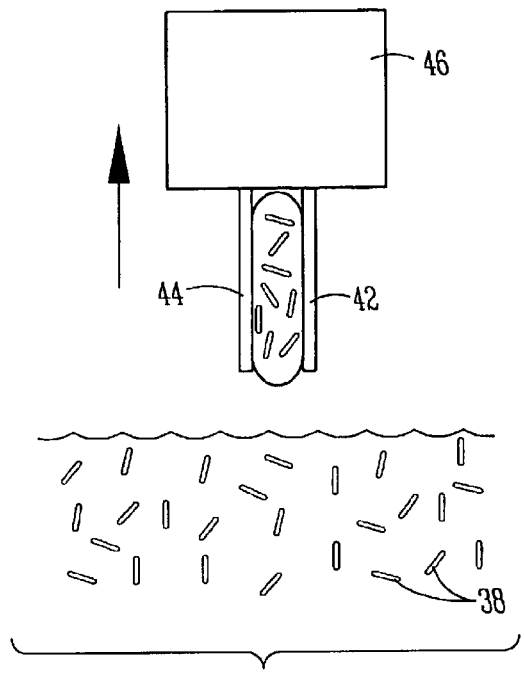
Figure 7:
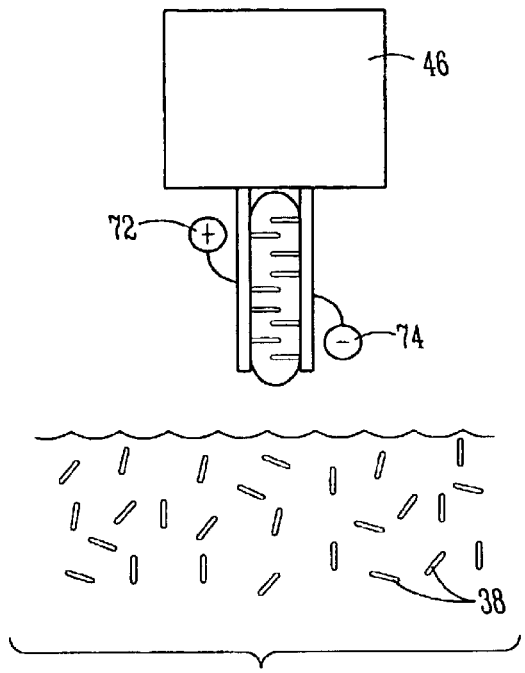

Once the plates 42 and 44 are adjusted to the desired spacing between them to provide a particular film thickness, the plates are withdrawn from the bath as shown in FIG. 6. A charge of the slurry 34 remains between the plates 42 and 44 of capacitor 40 due to the effect of surface tension of the liquid polymer interstitial material 36. After the plates 42, 46 are removed from the slurry 34 in the vat 32, plates 42 and 44 are connected to an appropriate voltage source to apply an electrostatic electric field between the plates as shown schematically in FIG. 7 by the positive and negative polarity symbols 72 and 74. The electrostatic field has the effect of aligning the carbon nanotubes in the slurry between the plates. The orientation of the aligned nanotubes is the same as the electric field so that the nanotubes are substantially perpendicular to capacitor plates 42 and 44.

Figure 8:
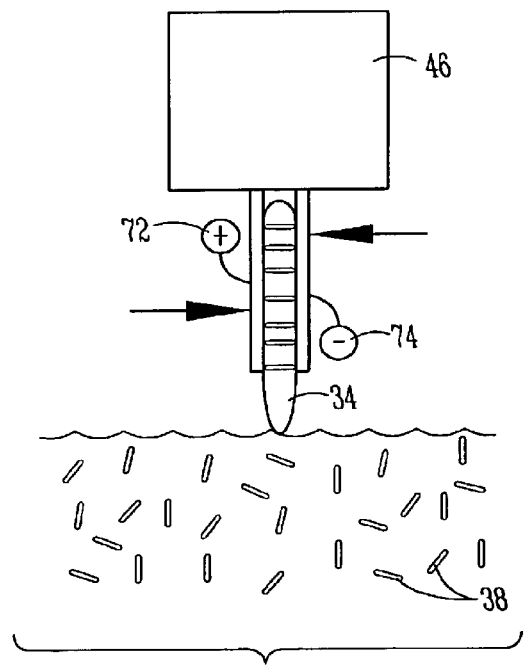
Figure 9:
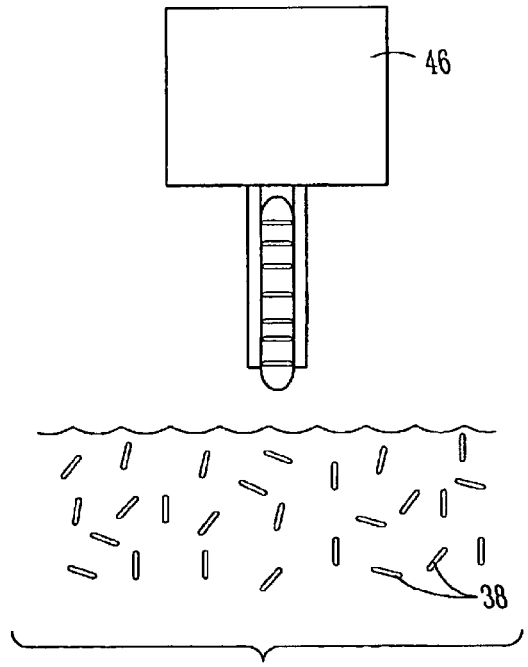

While the electric field is being applied and the nanotubes come into alignment, plates 42 and 44 may be brought closer together, as shown in FIG. 8, to squeeze out excess polymer 36 before commencing a curing phase which is commenced, in one embodiment, while the field is still being applied to assure that the nanotubes 38 remain properly oriented as curing commences. Curing is carried out, in one embodiment, by applying ultraviolet illumination to the composite material. In another embodiment, it is commenced by spraying a curing fluid on the material. In one embodiment, the curing is commenced while the field continues to be applied. In another embodiment, the field can be removed and curing thereafter commenced by relying upon the fact that the slurry has sufficient viscosity to hold the aligned nanotubes in an aligned orientation for a sufficient time period to carry out the curing to permanently hold the nanotubes in alignment.

At the completion of the curing phase, plates 42 and 44 are adjusted to open the gap between them to allow access to the billet of material which can in one embodiment be utilized in the form it is when removed or, in another embodiment, can be cut into a thermal interface structure 10 having the desired shape and dimensions.

Figure 10:
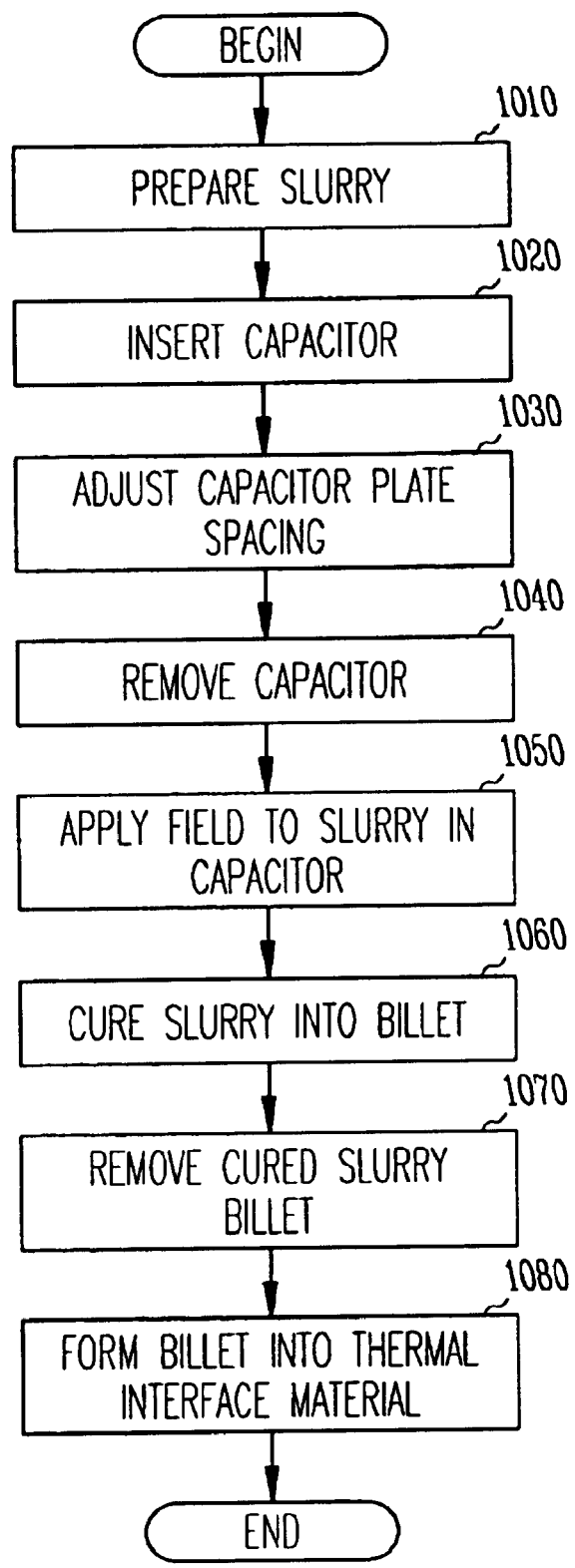
FIG. 10 is a process flow chart of the embodiment of the invention shown in FIGS. 3 through 9.

FIG. 10 is a flow chart showing the process carried out by the embodiment illustrated in FIGS. 3 through 9. In block 1010 a slurry of carbon nanotubes and polymer is prepared. In block 1020 one or more capacitors are inserted into the slurry and the spacing of the plates of the capacitor is adjusted in block 1030. The adjusted capacitor is removed from the slurry with a charge of slurry in block 1040 and an electrostatic electrical field is applied across the plates of the capacitor in block 1050. The slurry with aligned carbon nanotubes is then cured in block 1060 and the cured billet is removed from between the plates of the capacitor in block 1070. Finally the billet is, in one embodiment, formed into a thermal interface structure in block 1080. In another embodiment, the billet can be used as the thermal interface structure without further forming.

Figure 11:
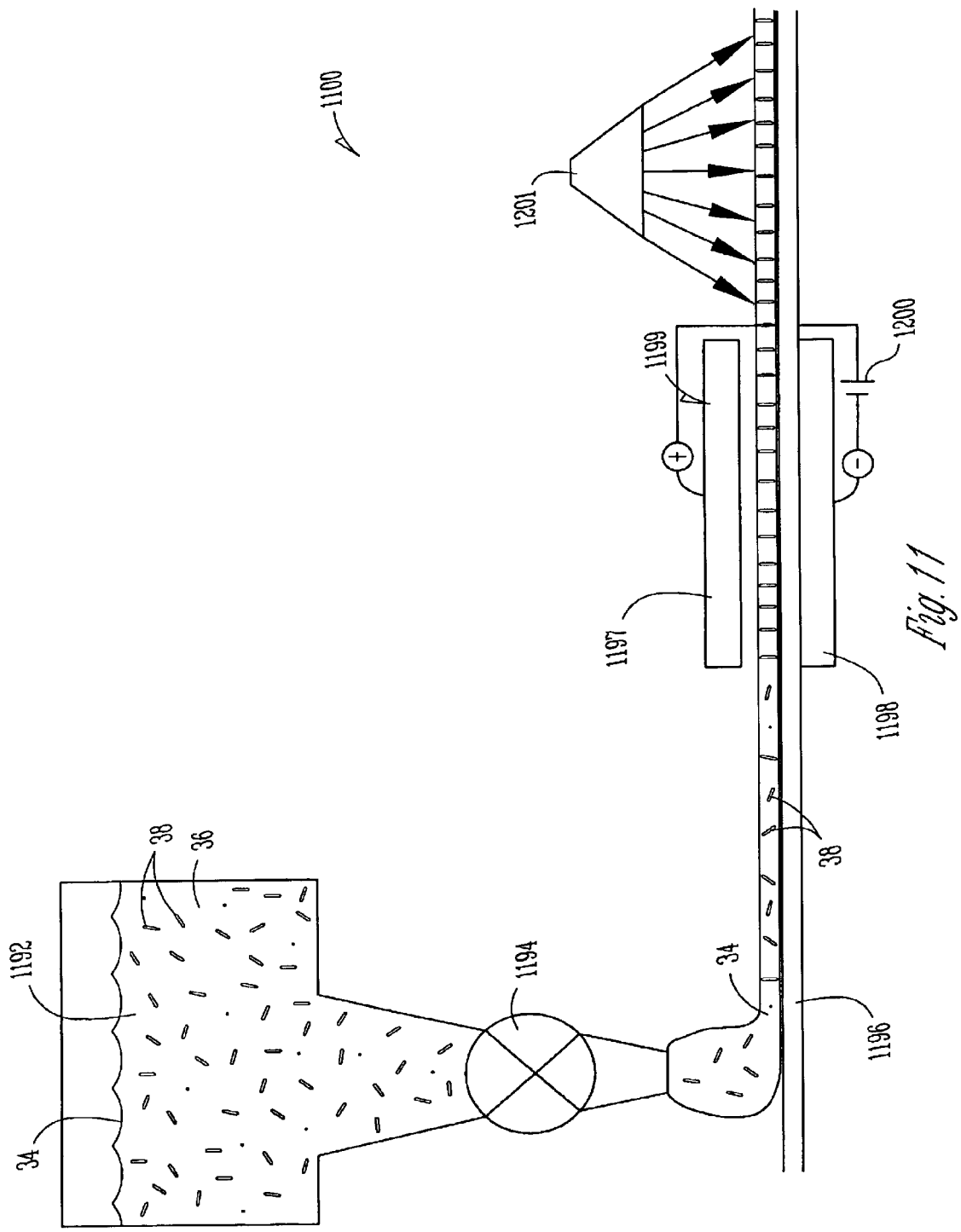
FIG. 11 is an illustrative elevational schematic of an a different apparatus for manufacturing thermal interface structures according to another embodiment of the invention.

FIG. 11 illustrates a different machine 1100, used in a continuous forming process according to a further embodiment of the invention. A hopper 1192 is loaded with a slurry 34 which is comprised of a monodisperse of carbon nanotubes 38 in an interstitial material 36 which is generally the same as the one loaded in vat 32 in the batch manufacturing embodiment shown in FIG. 3. Slurry 34 is dispensed from hopper 1192 through a control valve 1194 which acts in coordination with the movement of a conveyor 1196 to assure delivery of a layer of slurry 34 on conveyor 1196. As conveyor 1196 passes through a pair of plates 1197 and 1198 of a capacitor 1199 which are aligned and mounted above and below conveyor 1196, the spacing of the plates 1197 and 1198, in one embodiment, controls the thickness of the material. Plates 1197 and 1198 are connected to a voltage source 1200 to provide an electrostatic electrical field between the plates which forces the carbon nanotubes 38 into alignment with it. The material with its aligned nanotubes is transported by the conveyor 1196 from the plates 1197 and 1198 of capacitor 1199 to a curing station 1202.

In one embodiment, curing station 1202 is a curing lamp, such as an ultraviolet lamp which solidifies the polymeric material 36 of slurry 34. In another embodiment curing station 1202 delivers a chemical spray which hardens polymer 36. In both curing embodiments the degree to which the polymer is cured may be varied to provide, in one embodiment, a soft polymer which is advantageous for use as a thermal intermediate for mounting heat sinks to dies. In another embodiment, a harder polymer, which is more suitable to applications where the thermal intermediate is used under high pressure, further improves the heat transfer characteristics between the circuit or semiconductor die and the cooling solution or heat sink.

Figure 12:
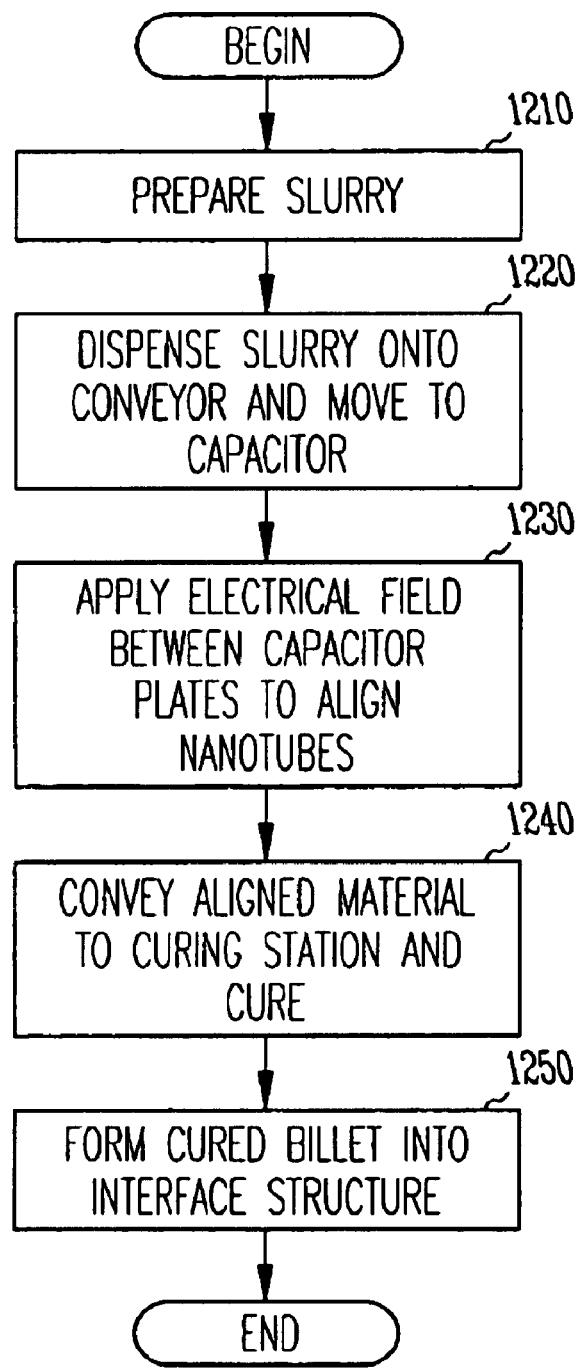
FIG. 12 is a process flow chart of the embodiment of the invention shown in FIG. 11.

FIG. 12 shows the process carried out in the apparatus shown in FIG. 11. Block 1210 is a preparation step where the slurry of carbon nanotubes and polymer is prepared in a manner similar to that shown for the embodiment described in FIGS. 3 through 10. The slurry is dispensed onto a conveyor in block 1220 and a field is applied between the plates of a capacitor bridging the conveyor and slurry in block 1230. After aligning the carbon nanotubes the conveyor in block 1240 moves the material to a curing area where it is cured and then proceeds to block 1250 where the cured billet is formed into a thermal interface structure having the desired dimensions.

It will be readily understood to those skilled in the art that various other changes in the details, material, and arrangements of the parts and method stages which have been described and illustrated in order to explain the nature of this invention may be made without departing from the principles and scope of the invention as expressed in the following claims.

What is claimed is:

1. A method of fabricating a thermal interface structure, the method comprising:

preparing a composite slurry of carbon nanotubes in a liquid polymer;

aligning the nanotubes in the composite slurry by applying an electrostatic field; and curing the composite slurry while continuing to apply the electrostatic field.

2. The method of claim 1 also comprising forming the cured composite slurry into a thermal interface structure.

3. The method of claim 2 wherein the aligning of the carbon nanotubes in the composite slurry is performed by applying an electrostatic field to the composite slurry.

4. The method of claim 3 wherein applying an electrostatic field to the composite slurry is performed by immersing at least a portion of a parallel plate capacitor in the composite slurry.

5. The method of claim 4 wherein the applying the electrostatic field to the composite slurry between the plates of the capacitor continues during at least a portion of the time during which curing of the polymer occurs.

6. The method of claim 4 wherein curing of the composite slurry is carried out, at least in part, during the aligning of the nanotubes in the composite.

7. The method of claim 4 also comprising forming the composite slurry into a billet.

8. The method of claim 7 wherein the length and width dimensions of the capacitor plates are larger than the length and width dimensions of the thermal interface structure.

9. The method of claim 7 wherein aligning the carbon nanotubes in the composite slurry comprises:

inserting at least one parallel plate capacitor in a bath containing the composite slurry;

adjusting the spacing of plates of the capacitor until the distance between them is substantially equal to the desired thickness of the billet;

applying an electrostatic field to the composite slurry between the plates; and removing the capacitor from the bath.

10. The method of claim 9 wherein applying an electrostatic field to the slurry between the plates comprises applying a voltage between the plates of the capacitor.

11. The method of claim 9 wherein curing the composite slurry is commenced while the electrostatic field is being applied.

12. The method of claim 3 wherein applying an electrostatic field to the composite slurry is performed by placing at least a portion of the composite slurry between plates of a parallel capacitor which are not in contact with the composite slurry.

13. The method of claim 3 wherein applying an electrostatic field comprises inserting at least one parallel plate capacitor in a bath containing the composite slurry;

adjusting the spacing of plates of the moving the plates of capacitor until the distance between them is substantially equal to the desired thickness of the thermal intermediate;

connecting the plates of the capacitor to a voltage source applying an electrostatic field to the slurry between the plates; and removing the capacitor from the bath.

14. The method of claim 1 wherein aligning the nanotubes in the slurry comprises:

dispensing the slurry onto a surface of a continuous conveyor as a layer of unaligned carbon nanotube composite; and applying an electrostatic field to the layer of unaligned carbon nanotube composite to form an aligned carbon nanotube composite with the carbon nanotubes substantially perpendicular to the surface of the conveyor.

15. The method of claim 14 wherein aligning the carbon nanotubes and curing the polymer are carried out while the continuous conveyor is moving the composite.

16. A method of fabricating a thermal interface material, the method comprising:

preparing a slurry of carbon nanotubes in a liquid polymer;

dispensing the slurry onto a surface of a conveyor as a layer of unaligned carbon nanotube composite;

applying an electrostatic field to the layer of unaligned carbon nanotube composite to form an aligned carbon nanotube composite with the carbon nanotubes substantially perpendicular to the conveyor; and curing the aligned carbon nanotube composite.

17. The method of claim 16 further comprising subdividing the aligned carbon nanotube composite into individual billets.

18. The method of claim 16 wherein applying the electrostatic field to the layer of unaligned carbon nanotube composite is performed by placing opposing plates of a capacitor adjacent opposing sides of the surface of the conveyor bearing the slurry.

19. A method of fabricating a thermal interface structure, the method comprising:

preparing a composite slurry of carbon nanotubes in a liquid polymer;

applying an electrostatic field to align the nanotubes; and curing the composite slurry.

20. The method of claim 19 also comprising forming the cured composite slurry into a thermal interface structure.

21. The method of claim 20 wherein the aligning of the carbon nanotubes in the composite slurry is performed by applying an electrostatic field to the composite slurry.

* * * * *

UNITED STATES PATENT AND TRADEMARK OFFICE
CERTIFICATE OF CORRECTION

PATENT NO. : 6,921,462 B2
DATED : July 26, 2005
INVENTOR(S) : Montgomery et al.

It is certified that error appears in the above-identified patent and that said Letters Patent is hereby corrected as shown below:

Column 5,
Line 37, after "composite" insert -- slurry --.

Signed and Sealed this

First Day of November, 2005

JON W. DUDAS
*Director of the United States Patent and Trademark Office*